(12) United States Patent
Chen et al.

(10) Patent No.: US 7,952,902 B2
(45) Date of Patent: May 31, 2011

(54) CONTENT ADDRESSABLE MEMORY (75) Inventors: Chieh Chi Chen, Taipei (TW); Sheng-De Wang, Taipei (TW)

(73) Assignee: National Taiwan University (TW)

( * ) Notice: Subject to any disclaimer, the term of this patent is extended or adjusted under 35 U.S.C. 154(b) by 120 days.

(21) Appl. No.: 12/421,183

(22) Filed: Apr. 9, 2009

(65) Prior Publication Data
US 2010/0182815 A1 Jul. 22, 2010

(30) Foreign Application Priority Data
Jan. 16, 2009 (TW) .................. 98101511 A (51) Int. Cl.
*G11C 15/00* (2006.01)
(52) U.S. Cl. .................. 365/49.1; 365/49.17; 365/49.18
(58) Field of Classification Search .................. 365/49.1, 365/49.17, 49.18, 49.11, 49.16
See application file for complete search history.

(56) References Cited

U.S. PATENT DOCUMENTS

| 6,493,793 | B1 * | 12/2002 | Pereira et al. | 711/108 |
| 7,389,377 | B2 * | 6/2008 | Gupta | 711/108 |
| 2004/0001380 | A1 * | 1/2004 | Becca et al. | 365/202 |

* cited by examiner

*Primary Examiner* — Anh Phung
*Assistant Examiner* — Hien N Nguyen
(74) *Attorney, Agent, or Firm* — The Weintraub Group, P.L.C.

(57) ABSTRACT

For receiving an input data, a pattern data and a data clock signal and outputting a hit signal and an address signal, a content addressable memory includes a plurality of content addressable memory units connected in series, each content addressable memory unit being adapted to receive the input data and the data clock signal and to output a comparison result signal, and an encoder coupled to the comparison result signal of each content addressable memory unit and adapted for outputting a hit signal and a memory address signal subject to the comparison result signal received.

16 Claims, 8 Drawing Sheets

FIG. 8

CONTENT ADDRESSABLE MEMORY

BACKGROUND OF THE INVENTION

1. Field of the Invention

The present invention relates to data memories and more particularly, to a content addressable memory that receives a pattern string of any length.

2. Description of the Related Art

Content addressable memory (hereinafter referred to as CAM) is a special type of computer memory used in certain very high speed searching applications. For example, CAM is commonly used in a network intrusion detection system to match the content of packets, filtering malicious packets. However, conventional CAMs simply can match a fixed length of pattern strings while the length of a pattern string in a network intrusion detection system is variable.

Figure 1:
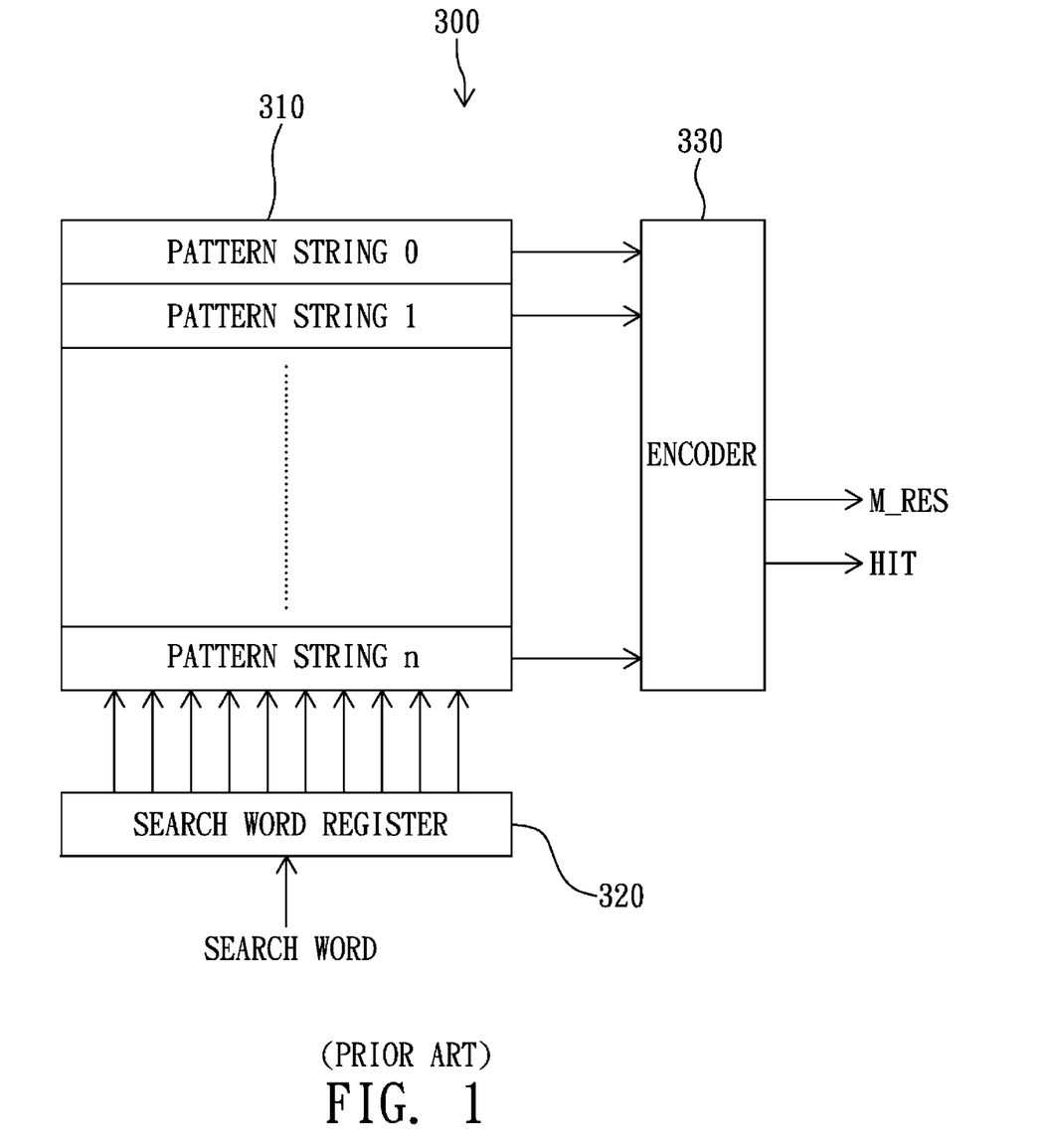
FIG. 1 is a block diagram of a CAM according to the prior art.

FIG. 1 is a block diagram of a CAM according to the prior art. As illustrated, a conventional CAM 300 comprises a storage list 310, a search word register 320 and an encoder 330. Inputted search word is stored in the search word register 320 for matching with the pattern string 0~n in the storage list 310. The length of one pattern string consist of 32~144 bits (4~18 bytes).

The storage list 310 of a typical CAM has hundreds to 32K items, and the relative address line consists of 7 bits to 15 bits. Every storage word has a respective match-line for indicating match case or mismatch case between the search word and the storage pattern string. The output of the match-line is sent to the encoder 330 that outputs a binary match address corresponding to the match-line through a signal M_RES.

Because there may be many words matched in the content addressable memory 300, the encoder 300 is usually a priority encoder but not a simple encoder. The priority encoder selects the highest priority match address to map the matched result. Normally, a word at a lower address has a relatively higher priority. Further, the encoder 330 outputs a signal HIT to indicate whether or not matched. Basically, the function of the content addressable memory 300 is to receive a search word, and then to send back the matched memory address. The content addressable memory 300 can be regarded as a programmable device to map an inputted large space search word onto a small space output match address.

According to the aforesaid conventional content addressable memory 300, the storage list 310 can only store pattern strings of a fixed length, for example, 36 bits~144 bits. In actual practice, pattern strings have different lengths. When storing relatively shorter pattern strings, the rest memory space will be a waste of space. On the contrary, pattern strings that are longer than the width of the storage list 310 will be cut off. In conclusion, the aforesaid conventional content addressable memory 300 has the drawbacks of: 1. wasting hardware space, and 2. unable to match long pattern strings.

SUMMARY OF THE INVENTION

The present invention has been accomplished under the circumstances in view. It is one object of the present invention to provide a content addressable memory, which receives a pattern string of any length. It is one object of the present invention to provide a content addressable memory, which effectively utilizes the memory space thereof.

To achieve these and other objects of the present invention, a content addressable memory is adapted for receiving an input data, a pattern data and a data clock signal and outputting a hit signal and an address signal, comprising a plurality of content addressable memory units connected in series and an encoder. Each content addressable memory unit is adapted to receive the input data and the data clock signal, and to output a comparison result signal. The encoder is coupled to the comparison result signal of each content addressable memory unit, and adapted for outputting a hit signal and a memory address signal subject to the comparison result signal received.

To achieve these and other objects of the present invention, a content addressable memory is adapted for receiving an input data, a pattern data and a data clock signal and outputting a hit signal and an address signal, comprising a plurality of content addressable memory units connected in series. Each content addressable memory unit is adapted to receive the input data and the data clock signal and to output a comparison result signal. Further, each content addressable memory unit comprises a first register for storing one set data of the content addressable memory units, a plurality of storage and compare modules, a first one of the storage and compare modules being coupled to the output end of said first register, each said storage and compare module being adapted for storing a pattern data and comparing the pattern word to the input data and then outputting a comparison result, a first multiplexer having a first input end coupled to the data output end of the first register and a second input end coupled to a carry input signal and a selection input end coupled to a cascade control input signal, a plurality of AND gates each having a first input end coupled to the comparison result output end of one storage and compare module, the first AND gate having a second input end coupled to the output end of the first multiplexer, a plurality of flip-flops connected in series by means of the AND gates, each flip-flop having a data input end coupled to the output end of one AND gate and a data output end coupled to the second input end of one AND gate, a second multiplexer having a selection input end coupled to the cascade output signal and a plurality of input ends respectively coupled to the data output ends of the flip-flops, and an encoder coupled to the comparison result signal of each content addressable memory unit and adapted for outputting a hit signal and a memory address signal subject to the comparison result signal received.

DETAILED DESCRIPTION OF THE PREFERRED EMBODIMENT

Figure 2:
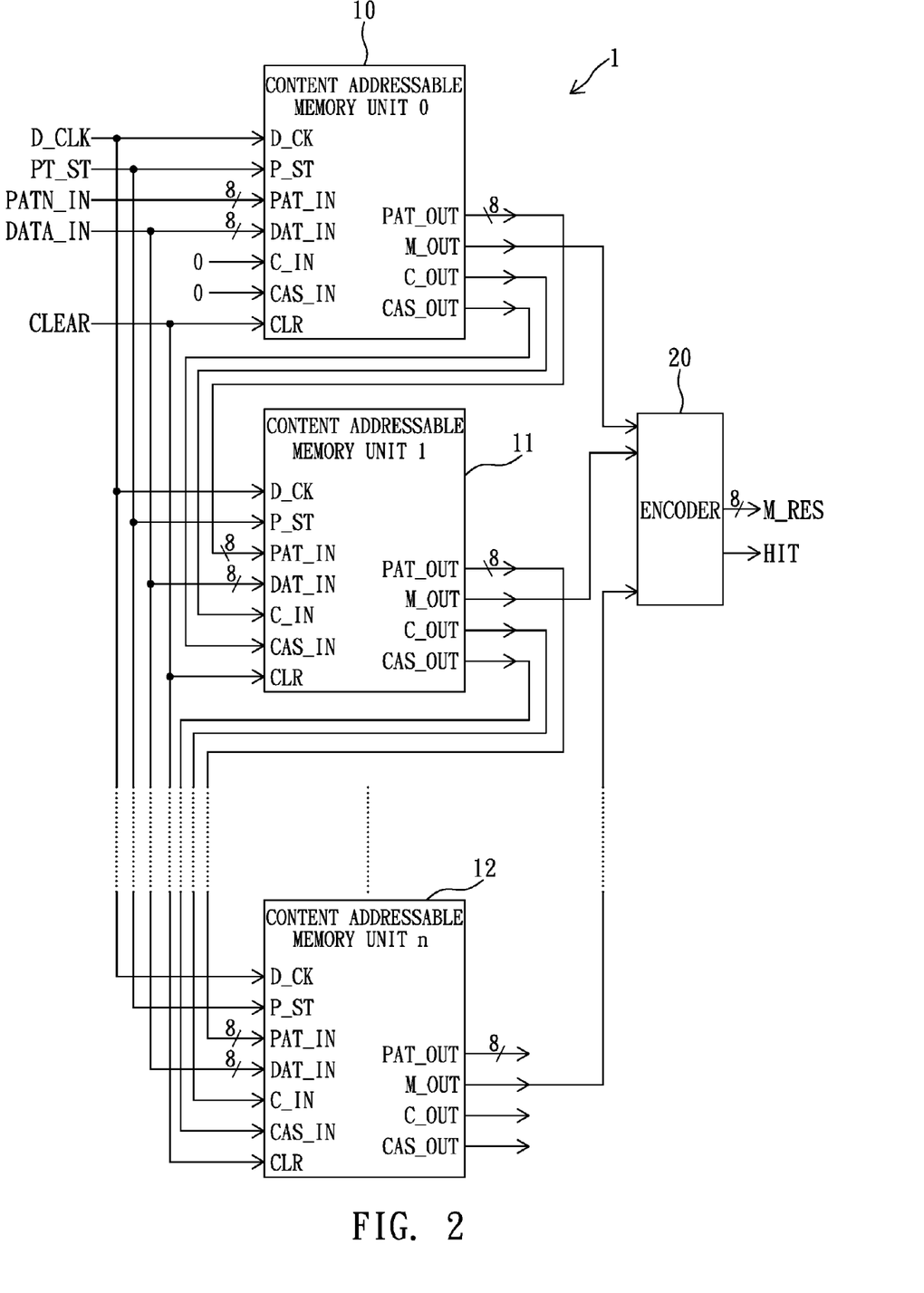
FIG. 2 is a system block diagram of a content addressable memory in accordance with the present invention.

FIG. 2 is a block diagram of a content addressable memory in accordance with the present invention.

As illustrated in FIG. 2, the content addressable memory, referenced by 1 is adapted for receiving an input data (DATA_IN), a pattern data (PATN_IN) and a data clock signal (D_CLK), and outputting a hit signal (HIT) and a memory address signal (M_RES). The content addressable memory 1 comprises a plurality of content addressable memory units 10~12 and an encoder 20.

Each content addressable memory unit 10~12 can receive the input data and the clock signal. By means of a respective cascade control input signal (CAS_IN) and a respective cascade output signal (CAS_OUT), the content addressable memory units 10~12 are connected in series. Further, each content addressable memory unit 10~12 can output a matching result signal (M_OUT). The number of the content addressable memory units 10~12 can be changed subject to actual requirements. According to this embodiment, the number of the content addressable memory units 10~12 is 3.

The encoder 20 is respectively coupled to the matching result signal (M_OUT) of each of the content addressable memory units 10~12, and adapted for outputting the hit signal (HIT) and the memory address signal (M_RES) subject to the matching result signal (M_OUT) of each of the content addressable memory units 10~12. As stated, the memory address signal (M_RES) can output a binary match address, indicating the matched address line. The encoder 20 can be, but not limited to, a priority encoder that selects the highest priority match address to map the result of match. Normally, a word at a lower address has a relatively higher priority.

As shown in FIG. 2, the content addressable memory units 10~12 receive an input data (DATA_IN) and a data clock signal (D_CLK) and output a hit signal (HIT) and a memory address signal (M_RES). The input data (DATA_IN) is synchronized with the data clock signal (D_CLK). Every clock pulse inputs one word. When the input data (DATA_IN) fulfills the storage pattern data of the content address memory units 10~12, the hit signal (HIT) outputs true, and the memory address signal (M_RES) outputs the matched match address.

Every content addressable memory unit 10~12 receives the input data (DATA IN), data clock signal (D_CLK), carry input signal (C_IN) and cascade control input signal (CAS_IN), and outputs a carry output signal (C_OUT) and a matching result signal (M_OUT). The matching result signal (M_OUT) is sent to the encoder 20, causing the encoder 20 to output the matching result (M_RES) and the hit signal (HIT).

According to this embodiment, the memory address signal (M_RES) has a width of 8-bits, corresponding to 256 content addressable memory units. Therefore, the output varies from 0~255. In FIG. 2, n=255 (because $2^8$=256). However, the width of the memory address signal (M_RES) can be determined subject to the actual number of the content addressable memory units. For example, when the width of the memory address signal (M_RES) is 15 bits, it corresponds to 32K content addressable memory units.

As shown in FIG. 2, the carry output signal (C_OUT) and cascade output signal (CAS_OUT) of the first content addressable memory unit 10 are respectively connected to the carry input signal (C_IN) and cascade control input signal (CAS_IN) of the posterior content addressable memory unit 11. By means of the cascade control signal, cascade control input signal (CAS_IN), cascade output signal (CAS_OUT), carry input signal (C_IN) and carry output signal (C_OUT) to transfer status data, the content addressable memory units 10~12 are functionally connected in series to match a pattern string of any length. For example, if one content addressable memory unit 10 is capable of matching a 8-byte pattern string, a series of two content addressable memory units 10 can match a 16-byte pattern string. When more number of content addressable memory units 10~12 are connected in series, they can match a relatively longer pattern string.

In order to set the settings of the content addressable memory units 10~12, each content addressable memory unit 10~12 according to the present preferred embodiment further comprises a PAT_ON, a P_ST and a PAT_OUT for data setting. The settings include pattern data, length of pattern data, enable control and cascade control. The PAT_ON and P_ST of the content addressable memory unit 10 are for receiving set data PATN_IN and set control signal PT_ST. The set data PATN_IN is synchronized with the set control signal PT_ST to store set data in the content addressable memory unit 10. For example, when an edge trigger register is used to store set data and pattern data, data delivered by the PATN_IN will be latched to the register during the rising edge or falling edge of the set control signal PT_ST. The PAT_OUT of the content addressable memory unit 10 is adapted for sending the set data to the posterior content addressable memory unit 11 for enabling the set data of every content addressable memory unit 10~12 to be set by means of a cascade method.

According to the present preferred embodiment, the content addressable memory units 10~12 have their PAT_ON and PAT_OUT connected in series and synchronized with PT_ST for setting the data of every content addressable memory unit 10~12. However, a different data setting measure may be designed by means of known techniques subject to actual requirements.

Figure 3:
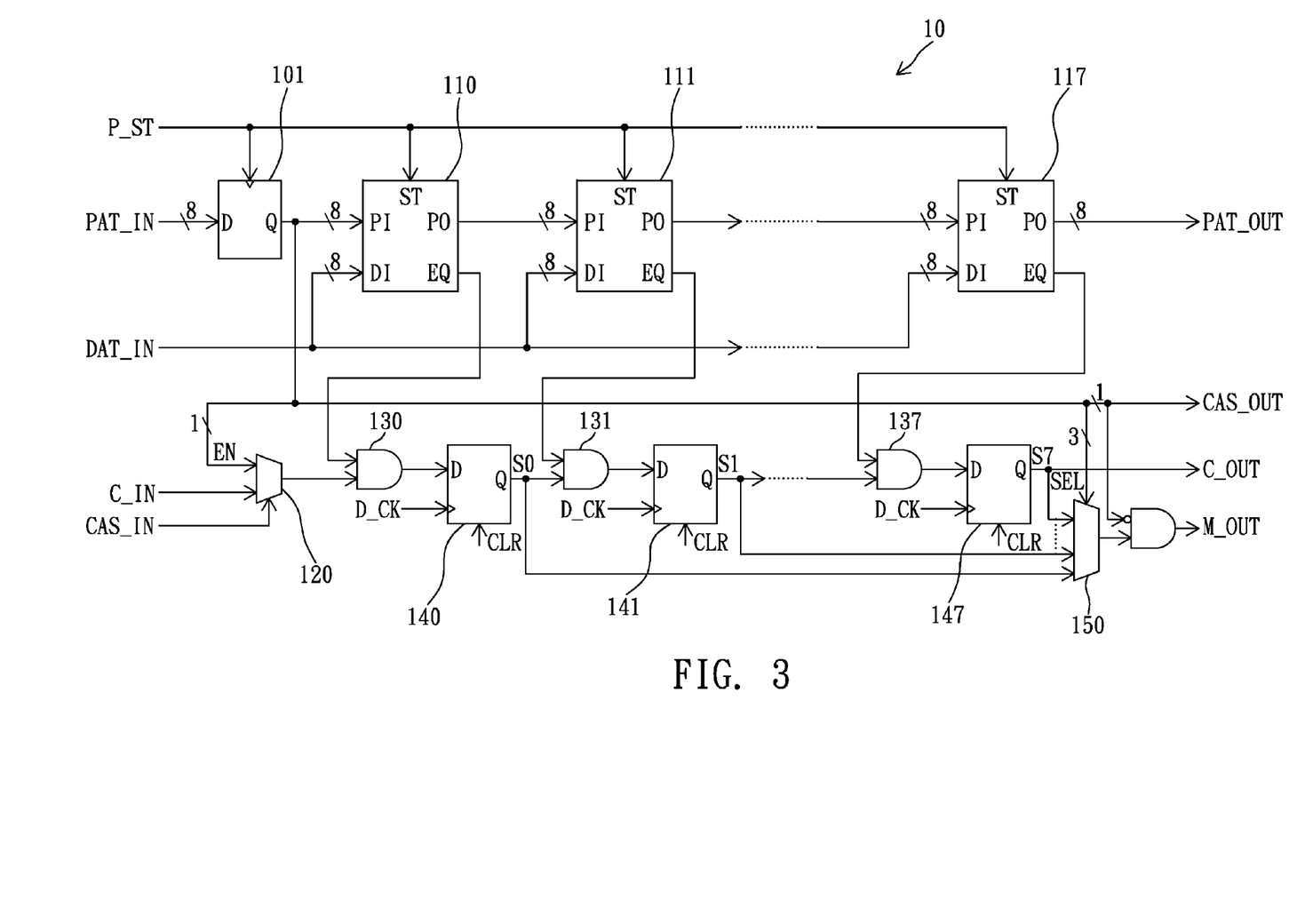
FIG. 3 is a circuit block diagram of one content addressable memory unit of the content addressable memory in accordance with the present invention.

FIG. 3 is a circuit block diagram of one content addressable memory unit of the content addressable memory in accordance with the present invention. The content addressable memory units 10~12 have the same structure. Each content addressable memory unit (the content addressable memory unit 10 is taken as an example) further comprises a first register 101, a plurality of storage and compare modules 110~117, a first multiplexer 120, a plurality of AND gates 130~137, a plurality of flip-flops 140~147, and a second multiplexer 150.

The first register 101 is a multibit register, for example, but not limited to, a 8-bit register for storing a set data of the content addressable memory unit 10. The set data includes, but not limited to, a length data, a unit enable data and a cascade control data. The control data is defined as follows: $0$~$2^{nd}$ bit is the pattern string length; the sixth bit is the cascade control signal CAS_OUT; the seventh bit is the enable control signal EN. Of course, data layout may be variously defined. According to the present preferred embodiment, one content addressable memory unit 10 comprises 8 storage and compare modules for matching a 8 bytes pattern string. In actual practiced, every content addressable memory unit 10 can be designed to match a predetermined pattern string length.

The storage and compare modules 110~117 include a first storage and compare module 110 that is coupled to the output end of the first register 101. Each of the storage and compare modules 110~117 is adapted for storing a pattern data, comparing the pattern data to the DAT_IN and then outputting a comparison result. According to the present preferred embodiment, one content addressable memory unit 10 comprises 8 storage and compare modules 110~117 for matching a 8 bytes pattern string. In actual practiced, every content addressable memory unit 10 can be designed to match a predetermined pattern string length.

The storage and compare modules 110~117 provide a storage function and a compare function. The storage function is for storing a pattern data. The compare function is for comparing the storage pattern data to word data inputted through the DAT_IN, and then outputting the comparison result EQ. When the inputted word data is in match with the storage pattern data, the comparison result EQ is true. When setting the content addressable memory units 10~12, the set data is inputted through PAT_IN synchronized with P_ST and to further store the data in the storage and compare module 110~117 and the register 101 by means of a cascade method. The input ports PI and output ports PO of the storage and compare modules 110~117 are for the setting of the pattern data of the storage and compare module 110~117 by means of a cascade method. However, this is not a limitation. A person skilled in the art can design different data setting means as a substitute.

The first multiplexer 120 has its one input end coupled to the data output end of the first register 101, its other input end coupled to a carry input signal C_IN, and its selection end coupled to the cascade control input signal CAS_IN.

The first multiplexer 120 is controlled by the cascade control input signal CAS_IN, and selects signal EN or carry input signal C_IN to provide an output to the AND gate 130. When the first multiplexer 120 outputs the signal EN to the AND gate 130, the signal EN is used to determine whether or not to enable the content addressable memory unit 10. According to the present preferred embodiment, when the signal EN is "1", the content addressable memory unit 10 is enabled; when the signal EN is "0", the content addressable memory unit 10 is disabled. When the content addressable memory unit 10 is enabled, it starts string match. When the content addressable memory unit 10 is disabled, it does not provide a string match function. When the first multiplexer 120 selects to output the carry input signal C_IN to the AND gate 130, the content addressable memory unit 10 is connected in series with the antecedent content addressable memory unit.

One comparison result output end of each storage and compare module 110~117 is coupled to one input end of one of the AND gates 130~137. The other input end of the first AND gate 130 is coupled to the output end of the first multiplexer 120.

Each flip-flop 140~147 has its data input end coupled to the output end of one of the AND gates 130~137, and its data output end coupled to the other input end of another of the AND gates 130~137. Further, the flip-flops 140~147 are connected in series by means of the AND gates 130~137. The flip-flops 140~147 can be, but not limited to, D-type flip-flops. The number of the storage and compare module 110~117 and the AND gates 130~137 can be, but not limited to, a multiple of 2.

The flip-flops 140~147 are connected in series for storing the current matching status and for enabling the AND gates 130~137 to control transmission of the status of the antecedent flip-flop to the next flip-flop. When the first multiplexer 120 selects to transmit the signal EN to the AND gate 130 subject to the control of the cascade control input signal CAS_IN, the status of the flip-flop 140 is determined subject to the output signal EQ and signal EN of the storage and compare module 110. When the first multiplexer 120 selects to transmit the carry input signal C_IN to the AND gate 130 subject to the control of the cascade control input signal CAS_IN, the data input D of the flip-flop 140 is determined subject to the output signal EQ and carry input signal C_IN of the storage and compare module 110. The carry input signal C_IN is connected to the carry output signal C_OUT of the antecedent content addressable memory unit, i.e., the last comparison result, thereby achieving series connection with the antecedent content addressable memory unit. The status of the flip-flops 140~147 are determined subject to the output signal EQ of the corresponding storage and compare modules 110~117 and the status of the corresponding antecedent flip-flops 140~147. The status of the flip-flop 147 is outputted to the carry output signal C_OUT. The input CLR of the flip-flops 140~147 is for clearing the status of the flip-flops 140~147. Before starting up data match, it is necessary to clear the status of the flip-flops 140~147.

The second multiplexer 150 comprises a selection input end SEL coupled to the length data signals, and a plurality of input ends respectively coupled to the data output ends S0~S7 of the flip-flops 140~17. The second multiplexer 150 selects one of the data output ends S0~S7 of the flip-flops 140~17 as the matching result of the content addressable memory unit 10 subject to the storage set data, for example, $0 \sim 2^{nd}$ bit of the first register 101. The cascade output signal CAS_OUT is adapted for controlling series connection of the content addressable memory unit 11 that is next to the content addressable memory unit 10. When decided to connect the next content addressable memory unit 11 in series subject to the cascade output signal CAS_OUT, the content addressable memory unit 10 does not output signal M_OUT. According to this embodiment, the content addressable memory unit 10 can match 8 pattern words. However, the number of pattern words to be compared by the content addressable memory unit 10 can be changed subject to actual requirements.

Figure 4:
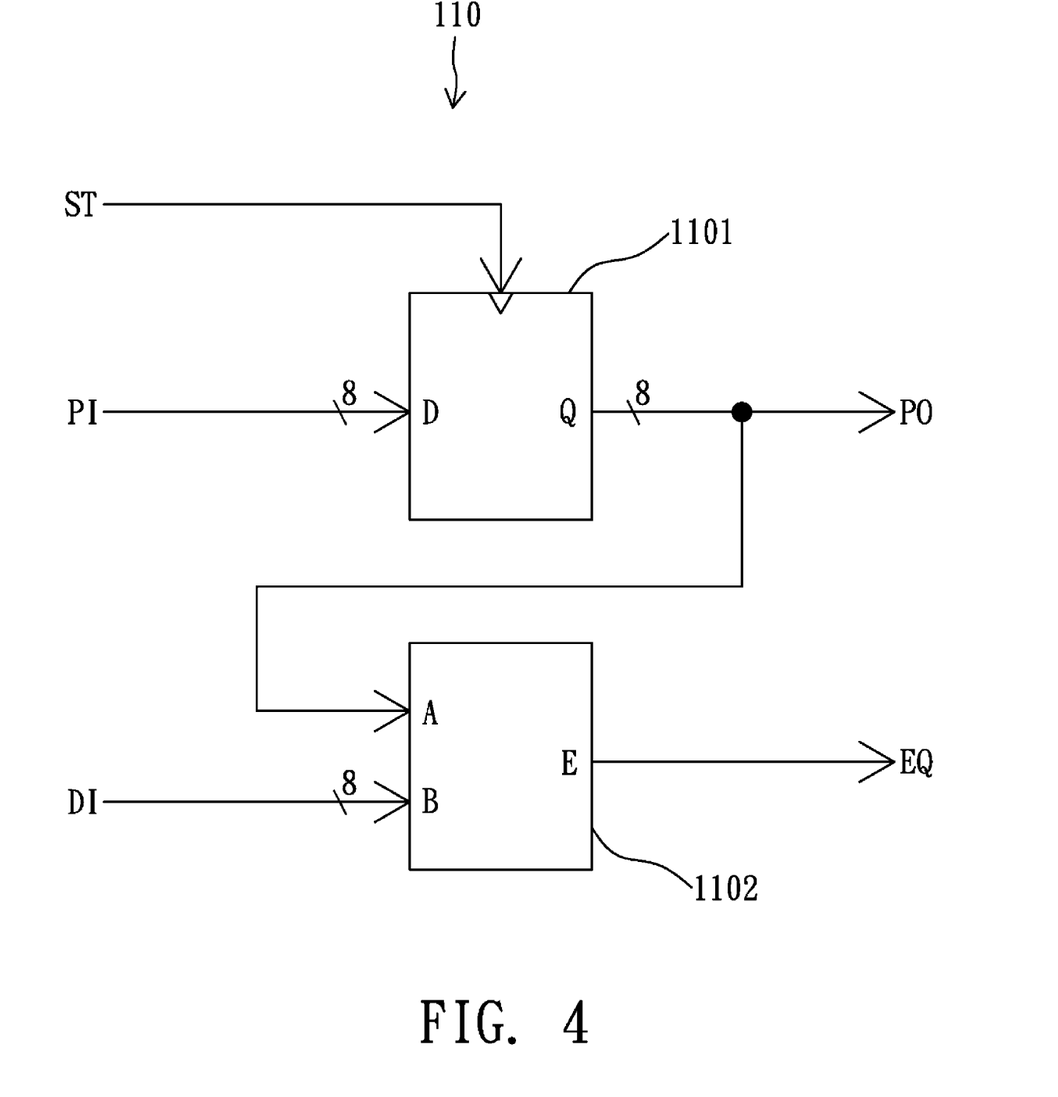
FIG. 4 is a schematic drawing showing the structure of one storage and compare module according to the present invention.

FIG. 4 is a schematic drawing showing the structure of one storage and compare module according to the present invention. As illustrated, each storage and compare module 110~117 further comprises a second register 1101 and a comparator 1102.

The second register 1101 is adapted for storing a pattern string, having its input end coupled to a pattern data input PI and its output end for a pattern data output PO.

The comparator 1102 has its first input end coupled to the pattern data output PO of the second register 1101, and its second input end coupled to the data input DI. After comparison, the comparator 1102 outputs the comparison result. When the pattern word and the input word are the same, the comparison result EQ is true.

Figure 5:
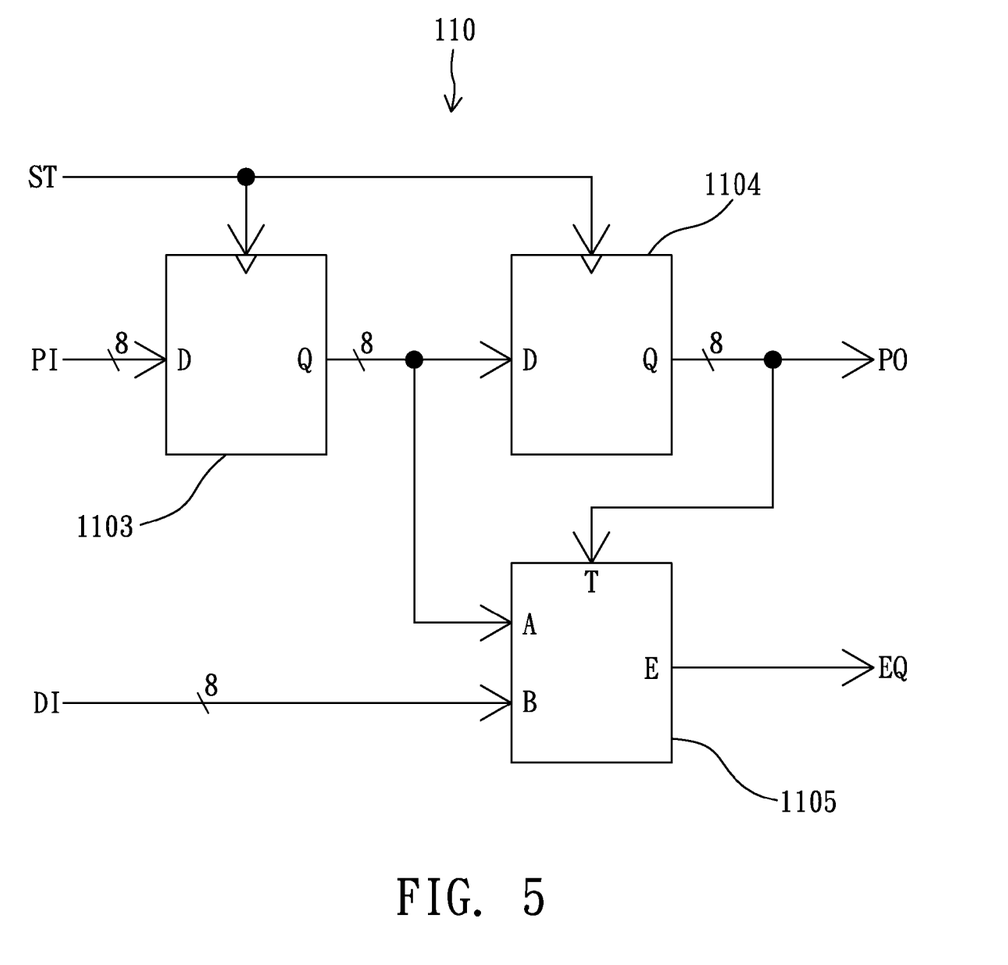
FIG. 5 is a schematic drawing showing the structure of an alternate form of the storage and compare module according to the present invention.

FIG. 5 is a schematic drawing showing the structure of an alternate form of the storage and compare module according to the present invention. The storage and compare modules 110~117 have the same structure. Each storage and compare modules 110 (the storage and compare module 110 is taken as an example) further comprises a third register 1103, a fourth register 1104, and a ternary comparator 1105.

The third register 1103 is adapted for storing pattern words, having its input end coupled to a pattern data input PI and its output end for output of a pattern data output Q.

The fourth register is adapted for storing ternary mask data, having its input end coupled to a pattern data output Q of the third register 1103 and its output end for output of a pattern data output PO.

The ternary comparator 1105 has its first input end coupled to the pattern data output Q of the third register 1103, its second input end coupled to the data input DI, and its ternary control end T coupled to the pattern data output PO of the fourth register 1104. The ternary comparator 1105 outputs the result EQ after comparison.

The pattern data stored in the third register 1103 is sent to the input end A of the ternary comparator 1105. The ternary mask data stored in the fourth register 1104 is sent to the input end T of the ternary comparator 1105. Inputted word data DI is sent to the input end B of the ternary comparator 1105. The ternary comparator 1105 matches the received pattern word and ternary mask with the inputted word data DI, and then outputs the comparison result EQ through the output end E. For example, when the pattern word is "a" (61h) and the ternary mask data is "DFh" (binary "1101|1111"), it means not to match the value of the fifth bit, thus the input word data shall be the capital letter "A" (41h) or the small letter "a" (61h), and the comparison result EQ of the comparator 1105 shall be true. Based on this architecture of storage and compare modules, the invention achieves the function of a ternary content addressable memory (TCAM). Because a ternary content addressable memory is of the known art, no further detailed structural description in this regard is necessary.

Figure 6:
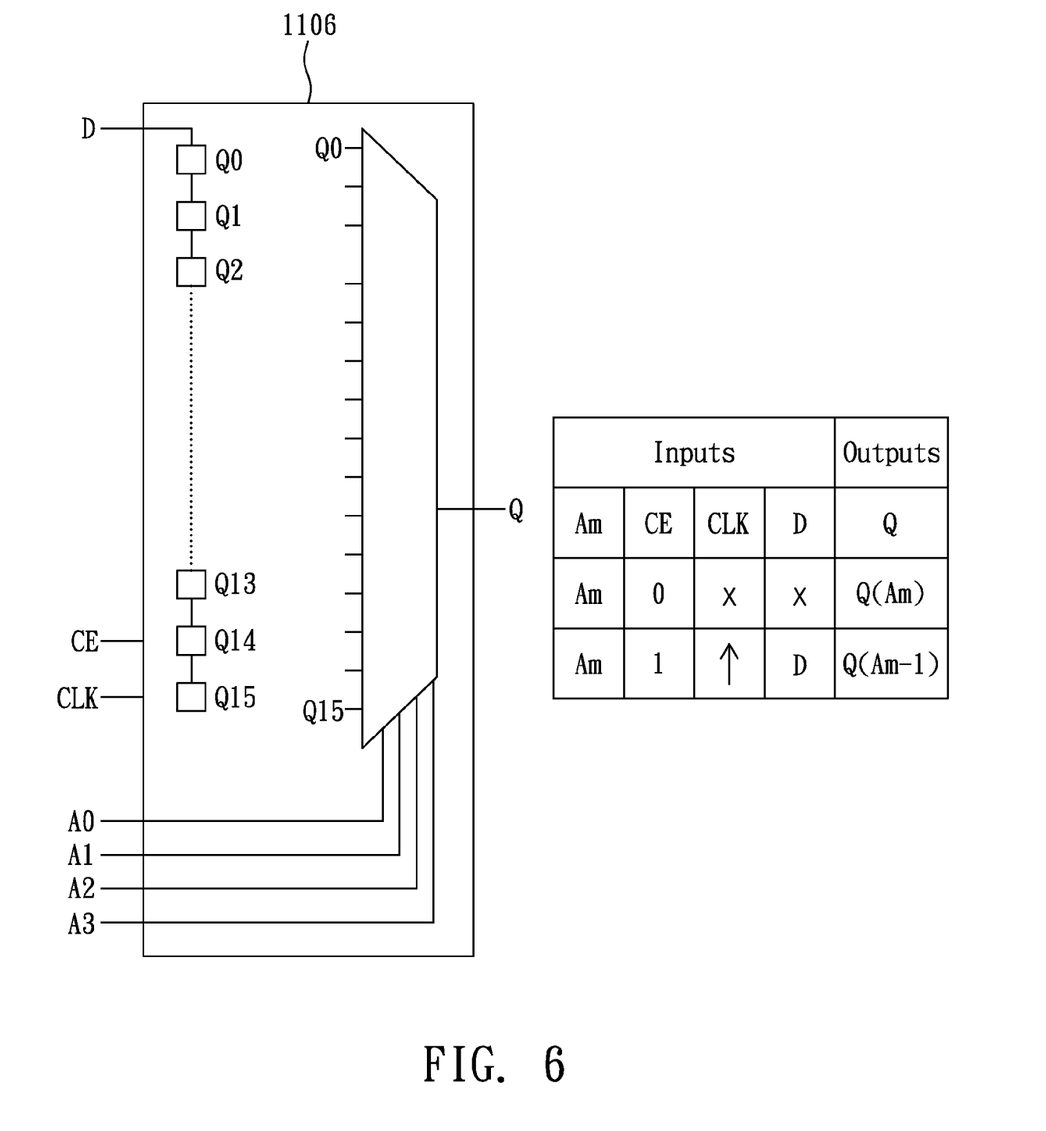
FIG. 6 is a schematic drawing showing the structure of a FPGA of SRL16E from Xilinx.

Further, the storage and compare modules 110~117 can be selected from FPGA of Xilinx's SRL16E (16-Bit Shift Register Look-Up-Table (LUT) with Clock Enable). FIG. 6 is a schematic drawing showing the structure of a FPGA of SRL16E from Xilinx. As illustrated in FIG. 6, when the input CE of the SRL16E 1106 is "1", it functions as a shift register of which the length is determined subject to the input A0~A3. When the input CE of the SRL16E 1106 is "0", the function of the SRL16E 1106 is to let the input A0~A3 determine the content of the register. Subject to the functions of the SRL16E 1106, the SRL16E 1106 can be used to achieve the function of the storage and compare module 110. For example, if the pattern data to be compared is a hexadecimal data 0x4, the content of the internal 16 registers will be "0000|0000|0001|0000". It is to be understood that the sign "|" is simply to help reading but not a part of the data. By means of utilizing the shift register function, i.e., setting the input CE to be "1" and shifting the content to the corresponding register and then setting the input CE to be "0", the SRL16E achieves the function of a comparator. When taking 0x4 as an example, the output Q will be "1" if the input of A0~A3 is "0100", and the output Q will be "0" under the other conditions.

Figure 7:
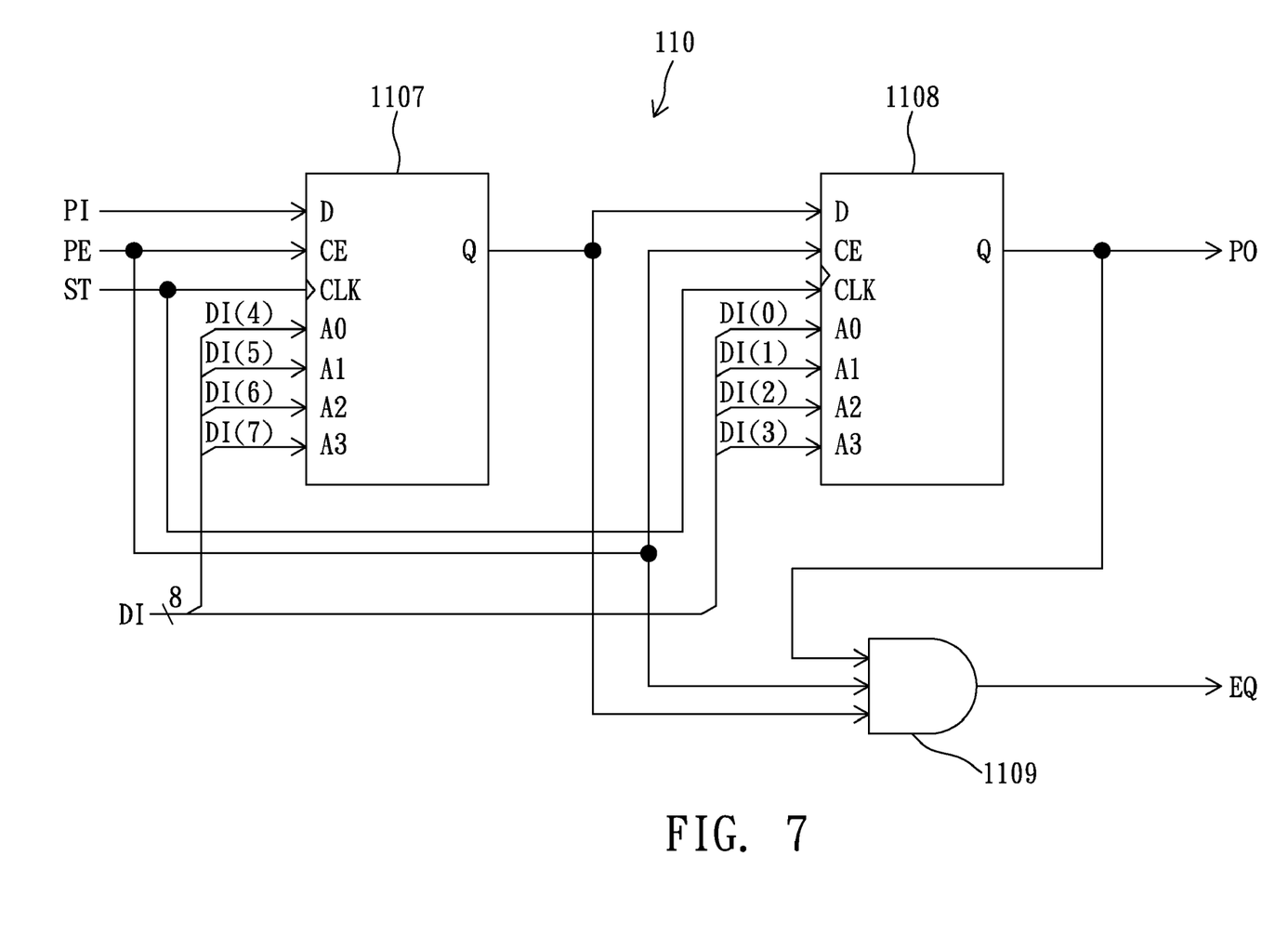
FIG. 7 is a schematic drawing showing a FPGA of SRL16E used to achieve storage and compare functions according to the present invention.

FIG. 7 is a schematic drawing showing a FPGA of SRL16E from Xilinx used to achieve storage and compare functions according to the present invention. As illustrated, the storage and compare module 110 comprises a SRL16E 1107, a SRL16E 1108, and an AND gate 1109. The SRL16E 1107 and SRL16E 1108 are adapted for providing storage and compare functions. For example, when the pattern words to be compared are "A" and "a", the ASCII codes are 0x41 and 0x61 respectively. Using two SRL16Es for practice, alter the input CE to "1" and input the value "1111" for A0~A3 to set the length of the shift register to be 16, and then send the set data into the input D, thus the set data can be stored in the register of the SRL16E by means of changing the input CLK, wherein the register of the SRL16E that is used to match 0x4 and 0x6 of MSB is set to be "0000|0000|0101|0000"; the register of the SRL16E that is used to match 0x1 of LSB is set to be "0000|0000|0000|0010". When changing the input CE to "0", the SRL16E will function as a comparator. When matching SRL16E of MSB, the output Q will be "1" only when the input of A0~A3 is 0x4 or 0x6, and the output Q will be "0" under the other conditions.

Figure 8:
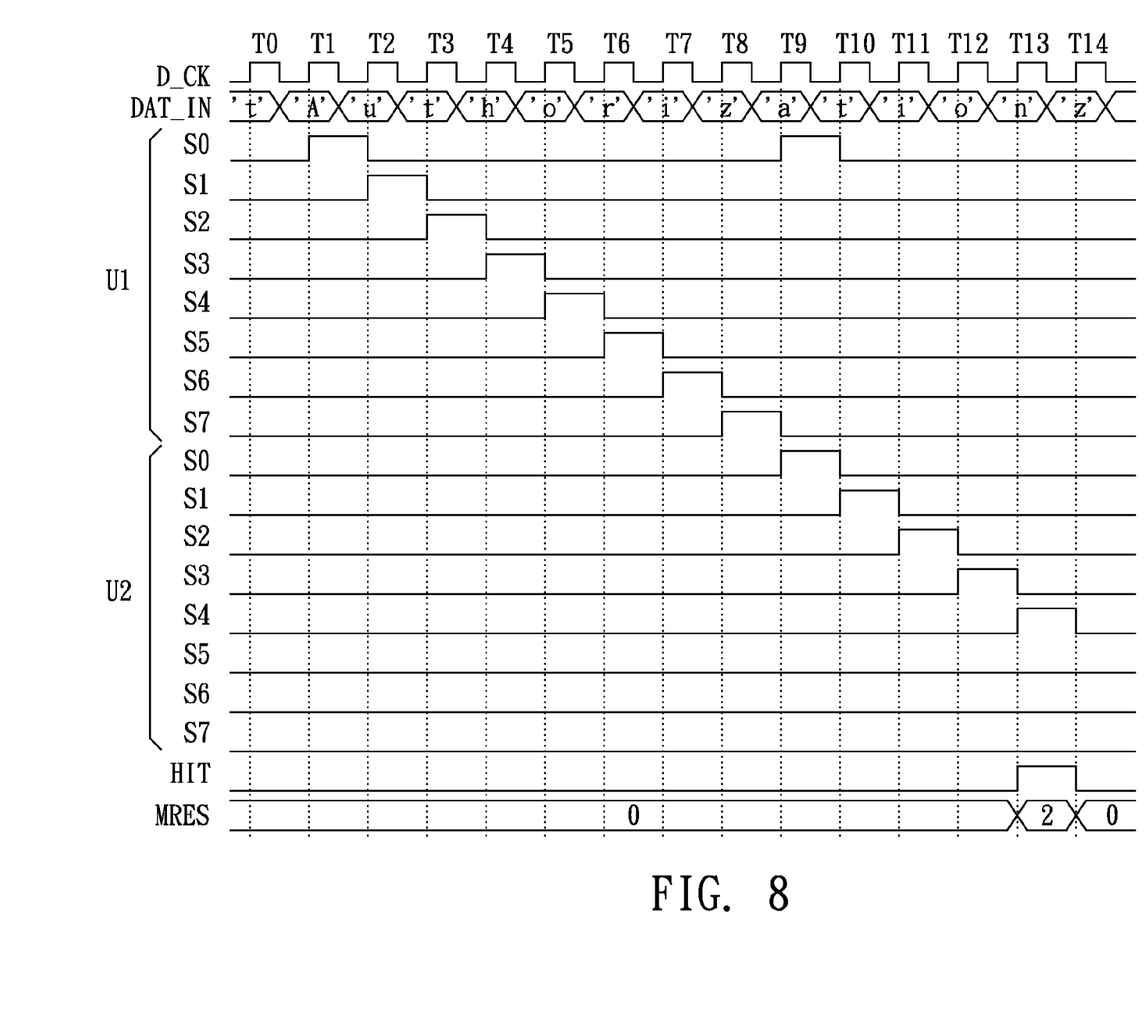
FIG. 8 is a schematic drawing showing input string match waveform of a content addressable memory with a ternary mask function in accordance with the present invention.

FIG. 8 is a schematic drawing showing input string match waveform of a content addressable memory with a ternary mask function in accordance with the present invention. As illustrated, S0~S7 represent the output of the flip-flops 140~147 of the storage and compare module 110 respectively. Assume the pattern string to be matched by the ternary mask type content addressable memory unit 10 is "authorization". When setting the pattern string data of the content addressable memory unit 10, the mask of the first character of the pattern string is set to be (DFH), enabling it to accept capital letter "A" (41H) or small letter "a" (61H). Thus, despite the first character of the pattern string is "a", the register S0 will be changed to "1" when the input character is "A". Therefore, by means of this setting, inputting the pattern string "authorization" or "Authorization" will output the fulfilled matching result.

Based on the aforesaid content addressable memory according to the present invention and by means of setting the set data of each individual content addressable memory unit, the length of the pattern string of each individual content addressable memory unit to be matched is determined, and the content addressable memory units of the content addressable memory can be connected in series for matching longer pattern data. Therefore, a content addressable memory provided by the present invention can receive a pattern string of any length. When compared with prior art content addressable memories, the invention involves an inventive step.

A prototype of content addressable memory has been constructed with the features of FIGS. The content addressable memory functions smoothly to provide all of the features disclosed earlier.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A content addressable memory for receiving an input data, a pattern data and a data clock signal and outputting a hit signal and an address signal, the content addressable memory comprising:
    a plurality of content addressable memory units connected in series, each said content addressable memory unit being adapted to receive said input data and said data clock signal and to output a comparison result signal; and
    an encoder coupled to the comparison result signal of each of said content addressable memory units and adapted for outputting a hit signal and a memory address signal subject to the comparison result signal received;
    wherein each said content addressable memory unit comprises a first register for storing a set data of the respective content addressable memory;
    a plurality of storage and compare modules, a first one of said storage and compare module being coupled to the output end of said first register, each said storage and compare module being adapted for storing a pattern data and comparing the pattern word to the input data and then outputting a comparison result;
    a first multiplexer, said first multiplexer comprising a first input end coupled to the data output end of said first register, a second input end coupled to a carry input signal, and a selection input end coupled to a cascade control input signal;
    a plurality of AND gates, each said AND gate comprising a first input end coupled to the comparison result output end of one said storage and compare module, a first one of said AND gate comprising a second input end coupled to the output end of said first multiplexer;
    a plurality of flip-flops connected in series by means of said AND gates, each said flip-flop comprising a data input end coupled to the output end of one said AND gate and a data output end coupled to the second input end of one said AND gate; and
    a second multiplexer, said second multiplexer comprising a selection input end coupled to the cascade output signal, and a plurality of input ends respectively coupled to the data output ends of said flip-flops.

2. The content addressable memory as claimed in claim 1, wherein said encoder is a priority encoder.

3. The content addressable memory as claimed in claim 1, wherein said set data comprises a length data, a unit enable data and a cascade control data.

4. The content addressable memory as claimed in claim 1, wherein the number of said storage and compare modules and the number of said AND gates are a multiple of 2.

5. The content addressable memory as claimed in claim 1, wherein said flip-flops are D-type flip-flops.

6. The content addressable memory as claimed in claim 1, wherein each said storage and compare module further comprises:
- a second register, said second register comprising an input end coupled to a pattern data input and an output end for outputting a pattern data output; and
- a comparator, said comparator comprising a first input end coupled to said pattern data output, a second input end coupled to the data input for comparison and output of the comparison result.

7. The content addressable memory as claimed in claim 1, wherein each said storage and compare module further comprises:
- a third register, said third register comprising an input end coupled to a pattern data input end and an output end for outputting a pattern data output;
- a fourth register, said fourth register comprising an input end coupled to the pattern data output of said third register and an output end for outputting a pattern data output; and
- a ternary comparator, said ternary comparator comprising a first input end coupled to the pattern data output of said third register, a second input end coupled to the data input, and a ternary control end coupled to the pattern output of said fourth register for comparison and output of the comparison result.

8. The content addressable memory as claimed in claim 1, wherein said storage and compare modules are formed of field programmable gate arrays.

9. A content addressable memory for receiving an input data, a pattern data and a data clock signal and outputting a hit signal and an address signal, the content addressable memory comprising a plurality of content addressable memory units connected in series, each said content addressable memory unit being adapted to receive said input data and said data clock signal and to output a comparison result signal, each said content addressable memory unit comprising:
- a first register, said first register for storing one set data of said content addressable memory units;
- a plurality of storage and compare modules, a first one of said storage and compare modules being coupled to the output end of said first register, each said storage and compare module being adapted for storing a pattern data and comparing the pattern word to the input data and then outputting a comparison result;
- a first multiplexer, said first multiplexer comprising a first input end coupled to the data output end of said first register, a second input end coupled to a carry input signal, and a selection input end coupled to a cascade control input signal;
- a plurality of AND gates, each said AND gate comprising a first input end coupled to the comparison result output end of one said storage and compare module, a first one of said AND gates comprising a second input end coupled to the output end of said first multiplexer;
- a plurality of flip-flops connected in series by means of said AND gates, each said flip-flop comprising a data input end coupled to the output end of one said AND gate and a data output end coupled to the second input end of one said AND gate;
- a second multiplexer, said second multiplexer comprising a selection input end coupled to the cascade output signal, and a plurality of input ends respectively coupled to the data output ends of said flip-flops; and
- an encoder coupled to the comparison result signal of each of said content addressable memory units and adapted for outputting a hit signal and a memory address signal subject to the comparison result signal received.

10. The content addressable memory as claimed in claim 9, wherein said encoder is a priority encoder.

11. The content addressable memory as claimed in claim 9, wherein said set data comprises a length data, a unit enable data and a cascade control data.

12. The content addressable memory as claimed in claim 9, wherein the number of said storage and compare modules and the number of said AND gates are a multiple of 2.

13. The content addressable memory as claimed in claim 9, wherein said flip-flops are D-type flip-flops.

14. The content addressable memory as claimed in claim 9, wherein each said storage and compare module further comprises:
- a second register, said second register comprising an input end coupled to a pattern data input and an output end for outputting a pattern data output; and
- a comparator, said comparator comprising a first input end coupled to said pattern data output, a second input end coupled to the data input for comparison and output of the comparison result.

15. The content addressable memory as claimed in claim 9, wherein each said storage and compare module further comprises:
- a third register, said third register comprising an input end coupled to a pattern data input end and an output end for outputting a pattern data output;
- a fourth register, said fourth register comprising an input end coupled to the pattern data output of said third register and an output end for outputting a pattern data output; and
- a ternary comparator, said ternary comparator comprising a first input end coupled to the pattern data output of said third register, a second input end coupled to the data input, and a ternary control end coupled to the pattern output of said fourth register for comparison and output of the comparison result.

16. The content addressable memory as claimed in claim 9, wherein said storage and compare modules are formed of field programmable gate arrays.

* * * * *